United States Patent [19]

Hillmann et al.

[11] Patent Number: 4,501,062
[45] Date of Patent: Feb. 26, 1985

[54] STABILIZED SUPER-CONDUCTOR HAVING A DIFFUSION-INHIBITING LAYER THEREIN AND METHOD OF PRODUCING SAME

[75] Inventors: Hans Hillmann; Engelbert Springer, both of Rodenbach, Fed. Rep. of Germany

[73] Assignee: Vacuumschmelze GmbH, Fed. Rep. of Germany

[21] Appl. No.: 470,179

[22] Filed: Feb. 28, 1983

[30] Foreign Application Priority Data

Feb. 27, 1982 [DE] Fed. Rep. of Germany ....... 3207159

[51] Int. Cl.$^3$ ........................................... H01B 12/00
[52] U.S. Cl. .................. 29/599; 174/126 S; 174/128 S
[58] Field of Search ............... 174/15 S, 126 S, 128 S; 29/599

[56] References Cited

U.S. PATENT DOCUMENTS

| | | | |
|---|---|---|---|
| 3,238,025 | 3/1966 | Pendleton et al. | 174/126 S |
| 3,652,967 | 3/1972 | Tanaka et al. | 174/126 S X |
| 3,918,998 | 11/1975 | Marancik et al. | 174/126 S X |
| 3,958,327 | 5/1976 | Marancik et al. | 29/599 |
| 3,996,661 | 12/1976 | Ziegler et al. | 29/599 |
| 4,135,293 | 1/1979 | Madsen et al. | 29/599 |
| 4,205,119 | 5/1980 | Young et al. | 174/128 S |

FOREIGN PATENT DOCUMENTS

| | | |
|---|---|---|
| 2826810 | 6/1978 | Fed. Rep. of Germany . |
| 52807 | 5/1981 | Japan .................. 174/126 S |

Primary Examiner—A. T. Grimley
Assistant Examiner—Morris H. Nimmo
Attorney, Agent, or Firm—Hill, Van Santen, Steadman & Simpson

[57] ABSTRACT

A stabilized super-conductor of the type containing a super-conductive region consisting of an intermetallic compound containing at least two elements, such as Nb$_3$Sn, and a normally-conductive region containing a material which is normally conductive during operational temperatures of the super-conductive region, such as Cu, with a diffusion-inhibiting layer, such as at least partially composed of Ta, positioned between the super-conductive and the normally-conductive regions is produced by providing a structure composed of a region of normally-conductive material and a region of super-conductive material, arranging a plurality of rod-shaped segments, at least some of which are composed of a diffusion-inhibiting material, between the normally conductive and the super-conductive regions and deforming the resultant structure one or more times, with intermediate annealing so as to attain a conductor having a desired reduced cross-section while causing the rod segments to combine with one another to form a diffusion-inhibiting layer.

10 Claims, 1 Drawing Figure

▨ COPPER CORE
▥ TANTALUM
▤ NIOBIUM RODS
▦ FILAMENTS
▧ EXTERIOR-COPPER-TIN BRONZE

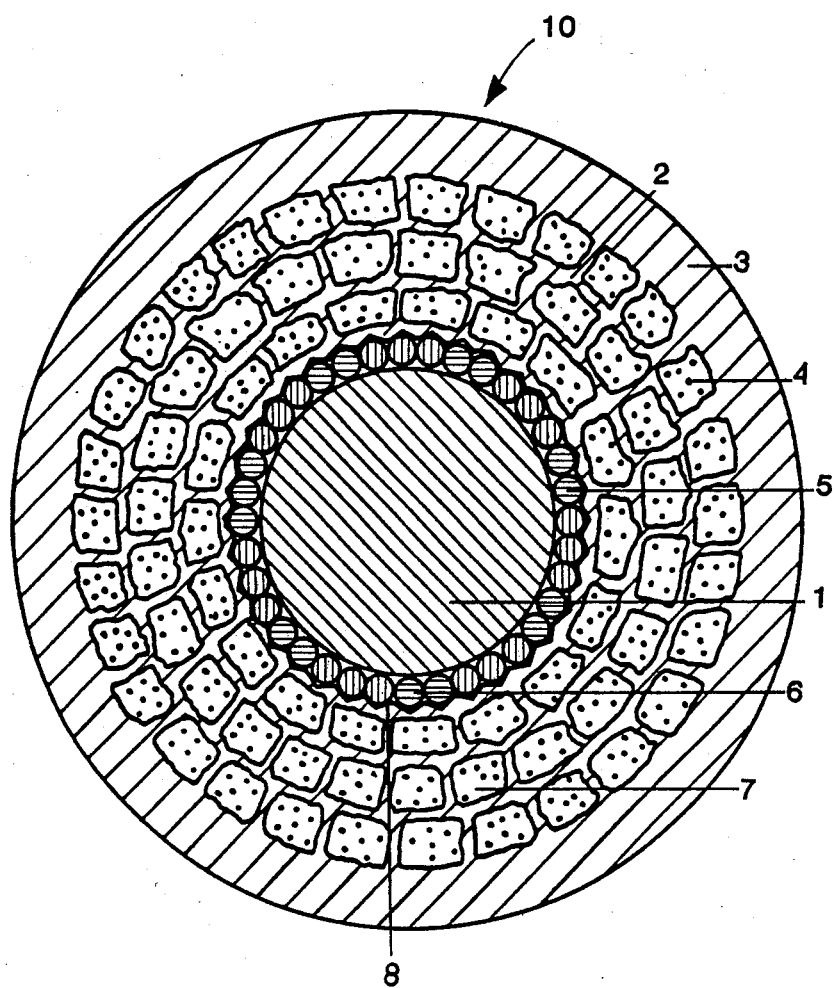

STABILIZED SUPER-CONDUCTOR HAVING A DIFFUSION-INHIBITING LAYER THEREIN AND METHOD OF PRODUCING SAME

BACKGROUND OF THE INVENTION

1. Field of the Invention

The invention relates to super-conductors and somewhat more particularly to stabilized super-conductors having a super-conductive region separated from a normally conductive region by a diffusion-inhibiting layer and a method of producing such stabilized super conductors.

2. Prior Art

Super-conductors having a super-conductive material composed of an intermetallic compound containing at least two elements, and, for stabilization, having a material which is normally conductive at operative temperatures of the super conductive material, with a diffusion-inhibiting material, such as tantalum, positioned between the cross-sectional regions of the normally-conductive and super-conductive materials are known. Such super-conductor structures are produced by first assembling the requisite components in proper order into a structural cross-section and subsequently deforming the so-assembled components one or more times, with intermediate annealing, so as to attain a cross-sectional reduction sufficient to obtain a desired structural cross-section.

Further details for a process of producing super-conductors of this type by this method are described in German Offenlegungsschrift No. 28 26 810. This prior art reference suggests that in manufacturing a stablized super-conductor, one can arrange a diffusion-inhibiting layer between the super-conductive regions and the regions which are normally conductive at operative temperatures of the super-conductive material. This diffusion-inhibiting layer typically is composed of tantalum for preventing tin (a typical element of the intermetallic compound forming the super-conductive material) from diffusing out of the region containing the super-conductive material into the copper (a typically normally conductive material), functioning to stabilize the super-conductor and thus from being able to reduce the conductivity of the copper region.

As a diffusion-inhibiting material, niobium, because it is more economical, can be utilized in place of tantalum. However, in such instance, tin (a typical element of the intermetallic compound forming the super-conductive material) would combine with the niobium diffusion-inhibiting layer to form a super-conductive $Nb_3Sn$ layer, which in operation leads to "large area" super-conductive currents. This has, as a consequence, shielding effects, field variations during the self-excitation of magnets associated with the super-conductor as well as problems in current passage.

SUMMARY OF THE INVENTION

The invention provides a stabilized super-conductor of the type described above wherein a novel diffusion-inhibiting layer is utilized and which can be composed of more economical materials than, for example, tantalum, without the above prior art disadvantages arising. Further, by following the principles of the invention, different size and different shape (e.g. six-sided) regions of normally conductive material can be separated from regions containing a super-conductive material by the novel diffusion-inhibiting layer. Independently of shaping a diffusion-inhibiting layer, such layer can, in accordance with the principles of the invention, be constructed from mutually similar pieces, so that providing a diffusion-inhibiting layer in instances of different conductors can occur in an economical and rapid manner. Yet further, by practicing the principles of the invention, a greater degree of safety against the formation of fissures, fractures and the like in a diffusion-inhibiting layer results.

In accordance with the principles of the invention, a stabilized super-conductor is comprised of a region of normally conductive material separated from a region of super-conductive material by a diffusion-inhibiting layer composed of contiguous areas, at least some of which are composed of a diffusion-inhibiting material.

In accordance with the principles of the invention, a stabilized super-conductor of the above type is produced by arranging a plurality of individual rod-shaped segments, at least some of which are composed of a diffusion-inhibiting material, between the region of a normally conductive material and the region of a super-conductive material prior to attainment of a desired super-conductor cross-section, and reducing the cross-section of the resulting arrangement under temperature-pressure conditions such that the individual segments combine to form a diffusion-inhibiting layer and the structure attains a desired cross-section.

In certain embodiments of the inventions, tantalum and niobium rod-shaped segments or rods are alternatively arranged next to one another and positioned between the regions of the normally conductive and the super-conductive materials. Even when the number of niobium rods provided is as high as 66% or 75% of the total number of rods utilized, the ultimately attained diffusion-inhibiting layer behaves substantially as if it was composed entirely of tantalum. During the cross-sectional reduction process (deformation or reactive annealing), super-conductive layers of, for example, $Nb_3Sn$ (in embodiments where the super-conductive region is composed of a copper-tin bronze) are indeed formed on the surfaces of the niobium segments or rods; however, throughout the overall surface area of the ultimately formed diffusion-inhibiting layer, which includes tantalum sections, contiguous super-conductive layers are avoided so that no large-surface, super-conductive currents can develop which would lead to instabilities, shielding effects and loses.

BRIEF DESCRIPTION OF THE DRAWING

The FIGURE is an elevated, somewhat schematic, cross-sectional view of an exemplary stabilized super-conductor constructed in accordance with the principles of the invention.

DESCRIPTION OF PREFERRED EMBODIMENTS

The exemplary super-conductor 10 illustrated in the drawings contains an interior cross-sectional region 1 composed of, for example, copper, which exhibits good conductivity properties, which functions to stabilize the super-conductor, and which is normally conductive at operating temperatures of the super-conductive material. The exterior cross-section region 2 is, for example, composed of a copper-tin bronze 3, in which filaments 4 composed of niobium are embedded to form a super-conductive material.

A plurality of rod-shaped segments or rods 5 and 6 are arranged next to one another and between the interior cross-section region 1 and the exterior cross-section region 2. In accordance with the principles of the invention, these rods are properly positioned prior to attainment of a final cross-sectional dimension of the overall super-conductor. A desired cross-section is dimensionally attained by a cross-section reduction in a step-by-step fashion through deformation, as by drawing through a wire-drawing machine, with intermediate annealing. In the exemplary embodiment under discussion, rod-shaped segments 5 are composed of niobium and rod-shaped segments 6 are composed of tantalum. As shown, the number of tantalum rods 6 is about ⅓ of the overall number of rods 5 and 6; however, a smaller or larger number of tantalum rods may be utilized. After assembling a conductor cross-sectional structure with the above components, the assembled but unfinished conductor is then deformed by a compression or drawing process such that the cross-section thereof becomes gradually reduced. Several compressions or drawing steps, with interposed intermediate annealing steps, can be utilized to attain a desired final cross-section.

As is apparent from FIG. 1, filaments 4 are combined in a plurality of sections or regions 7. This arrangement results from the fact that already compressed or drawn rods or the like formed from niobium filaments with a copper-tin bronze matrix have been provided for the construction of a super-conductor.

The rod-shaped segments 5 and 6 are illustrated in the exemplary embodiment in the form of round rods, however, they can also be multi sided, or be provided with other geometric cross-sections. What is important is that the subsequently assembled rods which will form the diffusion-inhibiting layer are comprised a plurality of adjacently arranged segments. During the deformation process to attain a desired conductor cross-section, these individual segments are pressed together, are welded together with one another, and yield a contiguous layer having discrete areas composed of different materials, at least one of which is a diffusion-inhibiting material, in the completed super-conductor. By producing super-conductors in this manner, it is not only possible to manufacture a diffusion-inhibiting layer having different materials in certain areas thereof, but it is also possible to attain all of the initially described advantages, including safety against fissure, crack or fracture formation and a freedom for shaping the cross-sectional region 1 in any desired form.

As a further simplification of the process for producing super-conductors in accordance with the principles of the invention, the individual rods 5 and 6, which ultimately form a diffusion-inhibiting layer, can be initially held together by being wound with a sheet 8, for example, a sheet composed of a copper-tin bronze, on the circumference of the inner cross-sectional region 1.

In the exemplary embodiment illustrated, the rod-shaped segments 5 and 6 are arranged substantially parallel to the central axis of the super-conductor. However, the rod-shaped segments can also be arranged so as to surround the region 1 in a spiral fashion.

With the foregoing general discussion in mind, there is now presented a detailed exemplary embodiment of the invention which will illustrate to those skilled in the art the manner in which this invention is practiced. This exemplary embodiment is included merely to aid in the understanding of the invention and variations may be made by those skilled in the art without departing from the spirit and scope of the invention.

EXEMPLARY EMBODIMENT

A filament-containing rod (section or region 7) was composed of tubes having hexagonal cross-sections. In each tube there was disposed one of 54 niobium bolts. The tubes were composed of a Cu-Sn bronze having 87% by weight Cu and 13% by weight Sn. The cross-sectional ratio of bronze to niobium was 1:2.

The opening (distance between opposing edges) of the niobium-containing tube was 4.62 mm. The composed rod was extrusion-pressed into a bronze-niobium compound and divided into individual segments, each having a length of 200 mm. As a consequence, 126 compound rods, consisting of bronze with niobium filaments or conductors embedded therein and separated from one another, were obtained.

A cylindrical core of highly conductive copper having a diameter of about 40 mm was surrounded by tantalum and niobium rods, each having a 1 mm diameter. The tantalum and niobium rods were arranged about the core, viewed in the circumferential direction, in a repeating sequence of 3 tantalum rods and 2 niobium rods so that the ultimately attained diffusion-inhibiting layer had about 60% of the surface area thereof composed of the diffusion-inhibiting material (tantalum).

The assembled conductor structure (Cu core, ring of Ta and Nb rods, compound Nb-containing rods, bronze filler pieces for filling out the remaining interstices) was inserted into an envelope tube composed of bronze (same composition as set forth earlier) and having a 80.5 mm exterior diameter and a 70 mm interior diameter, sealed with a lid, evacuated and welded in a vacuum-tight manner. Subsequently, the thus-assembled structure (bolt) was subjected to pressure at a temperature of about 700° C. and pressed out to a diameter of 26 mm and, by drawing in wire-drawing machines, with intermediate annealing, was processed to a final conductor cross-section having a diameter of 0.7 mm.

In the foregoing arrangement, the number of sections or regions 7 containing Nb filaments embedded in bronze is dependent upon use conditions of the super-conductor (current, influencing alternating fields, etc.). The number of such sections and spacing thereof does not influence the performance of the attained diffusion-inhibiting layer.

The invention can be utilized for constructing all super-conductors in which the super-conductive material is composed of a super-conductive intermetallic compound containing at least two elements. The invention is thus equally applicable to, for example, $Nb_3Sn$ or $V_3Ga$ super-conductive materials. In instances where, for example, the super-conductive intermetallic compound is $V_3Ga$, the diffusion-inhibiting layer can still be formed from niobium and tantalum rods; however, vanadium rods can be used in place of the niobium rods if desired. By following the principles of the invention with any desired super-conductive material of this type, one can prevent the conventional heat treatment, utilized to form the intermetallic compound, from causing the lower melting point element of the intermetallic compound to penetrate the normally conductive stabilizing material (Cu) provided in the super-conductor to stabilize the same.

As is apparent from the foregoing specification, the present invention is susceptible of being embodied with various alterations and modifications which may differ particularly from those that have been described in the precedings specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a method of producing a stabilized super-conductor having a cross-sectional region of a super-conductor material consisting of an intermetallic compound containing at least two elements and having a cross-sectional region of a material which is normally conductive at operating temperatures of the super-conductive material, with a layer of a diffusion-inhibiting material positioned between the cross-sectional regions of the normally conductive material and the super-conductive material whereby a stabilized super-conductor cross-section is first assembled from all said materials and the assembled structure is subsequently deformed one or several times with intermediate annealing for reducing the cross-section of such structure until a desired cross-section dimension is attained, wherein the improvement comprises:

arranging, prior to deformation for attainment of a desired cross-section dimension, a plurality of individual rod-shaped segments, at least some of which are composed of a diffusion-inhibiting material, between said regions of normally conductive material and super-conductive material; and subjecting the so-assembled structure to deformation conditions sufficient to combine said individual segments into a diffusion-inhibiting layer while attaining a desired conductor cross-section dimension.

2. In a method as defined in claim 1 wherein said rod-shaped segments each have a round cross-section and are inserted between the cross-sectional region of the normally conductive material and the cross-sectional region of the super-conductive region prior to deformation of the so-assembled structure.

3. In a method as defined in claim 1 wherein said rod-shaped segments each have a multi-sided cross-section and are inserted between the cross-sectional region of the normally conductive material and the cross-sectional region of the super-conductive region prior to deformation of the so-assembled structure.

4. In a method as defined in claim 1 wherein said rod-shaped segments are wound with a sheet for retaining said segments in a desired position within the assembled conductor structure.

5. In a method as defined in claim 4 wherein said sheet is composed of a copper-tin bronze.

6. In a method as defined in claim 1 wherein some of said rod-shaped segments are composed of niobium and some are composed of tantalum, said niobium segments being positioned alternately with said tantalum segments so that the subsequently formed diffusion-inhibiting layer possesses some areas of niobium with interposed areas of tantalum.

7. In a method as defined in claim 6 wherein said niobium segments comprise about 66% to 75% of the total number of segments positioned between said areas.

8. In a method as defined in claim 6 wherein said niobium and tantalum segments are arranged between the cross-sectional regions of normally conductive material and super-conductive material in such a manner that a repeating sequence of three tantalum segments adjacent to two niobium segments is attained.

9. In a method as defined in claim 6 wherein said super-conductive material is $Nb_3Sn$.

10. In a method as defined in claim 6 wherein said super-conductive material is $V_3Ga$.

* * * * *